(12) United States Patent
Misium

(10) Patent No.: US 6,277,682 B1
(45) Date of Patent: Aug. 21, 2001

(54) SOURCE DRAIN IMPLANT PROCESS FOR MIXED VOLTAGE CMOS DEVICES

(75) Inventor: George R. Misium, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/382,920

(22) Filed: Aug. 25, 1999

Related U.S. Application Data

(60) Provisional application No. 60/097,826, filed on Aug. 25, 1998.

(51) Int. Cl.$^7$ ............................................. H01L 21/8238
(52) U.S. Cl. ........................ 438/199; 438/217; 438/228; 438/303; 438/231; 438/595
(58) Field of Search .................................. 438/199, 217, 438/227, 228, 231, 302, 303, 305, 307, 525, 595

(56) References Cited

U.S. PATENT DOCUMENTS

| | | | |
|---|---|---|---|
| 5,047,358 | * | 9/1991 | Kosiak et al. ........................ 437/34 |
| 5,606,191 | * | 2/1997 | Wang ................................. 257/336 |
| 5,686,324 | * | 11/1997 | Wang et al. ........................ 437/34 |
| 5,827,747 | * | 10/1998 | Wang et al. ........................ 438/199 |
| 6,020,231 | * | 2/2000 | Wang et al. ........................ 438/228 |
| 6,100,125 | * | 8/2000 | Hulfachor et al. ................. 438/224 |

* cited by examiner

Primary Examiner—Matthew Smith
Assistant Examiner—Igwe U. Anya
(74) Attorney, Agent, or Firm—Carlton H. Hoel; W. James Brady; Frederick J. Telecky, Jr.

(57) ABSTRACT

A mixed voltage CMOS process for fabricating transistors with different source-drain profiles is described. The present invention comprises a method for manufacturing a CMOS integrated circuit with a low voltage device 24 and a high voltage device 26 comprising the steps of obtaining active regions in a substrate 10 with gates 30 and 32 for the low voltage device 24 and the high voltage device 26, respectively, obtaining lightly implanted source and drain extensions 38 and 40 for the low voltage device 24, forming a side wall 42, 44, 46 and 48 next to each gate 30 and 32, and angularly implanting each of the source and drain regions 52, 54, 56 and 58 with an impurity 50 of a selected type for both the low voltage device 24 and the high voltage device 26, to eliminate the need for separately implanting the first voltage device and second voltage device with different source-drain extensions. The method of the present invention tailors the source-drain implant conditions (energy, dose, angle 60, and thermal drive) to create the source-drain profiles of a reliable high voltage device 26 without degrading the performance of the low voltage device 24.

22 Claims, 5 Drawing Sheets

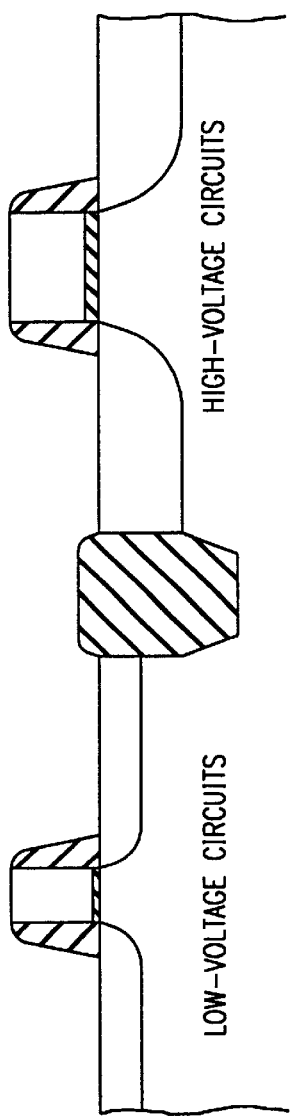
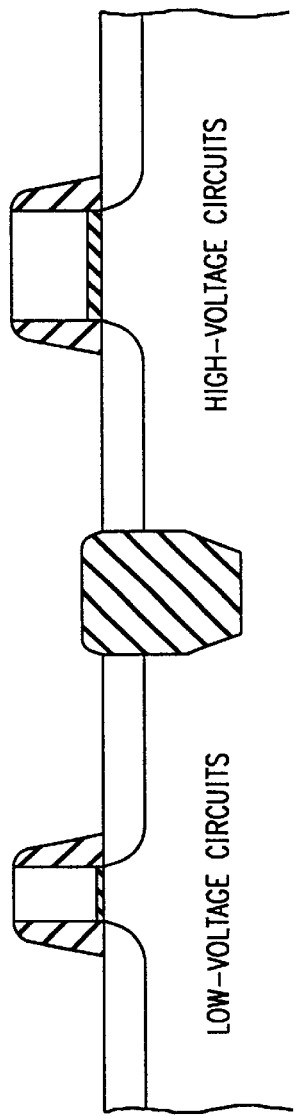
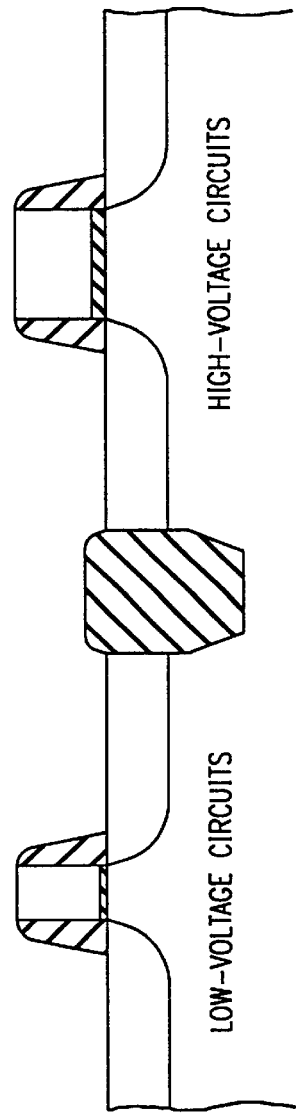
FIG. 1 (PRIOR ART)
FIG. 2 (PRIOR ART)
FIG. 3 (PRIOR ART)

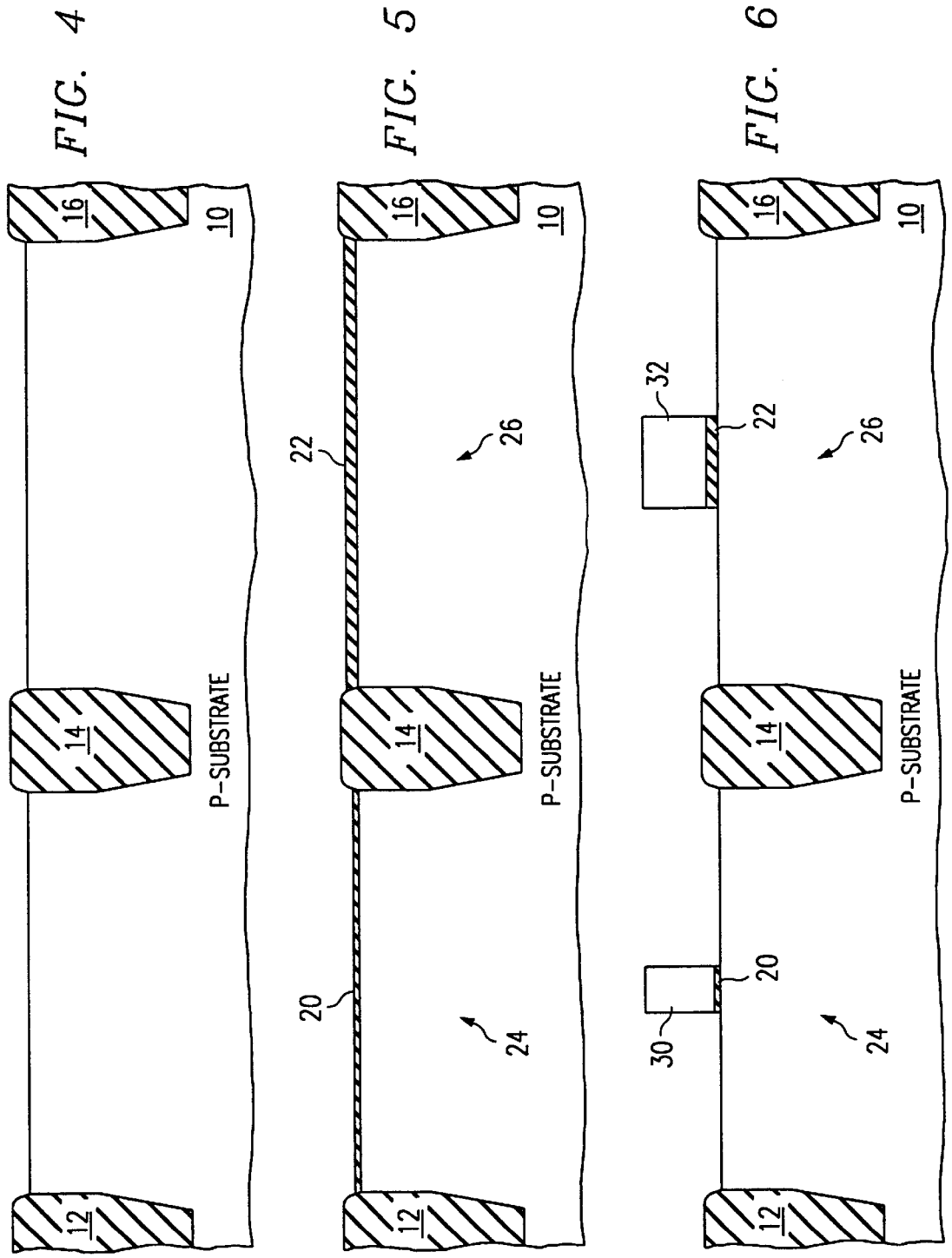

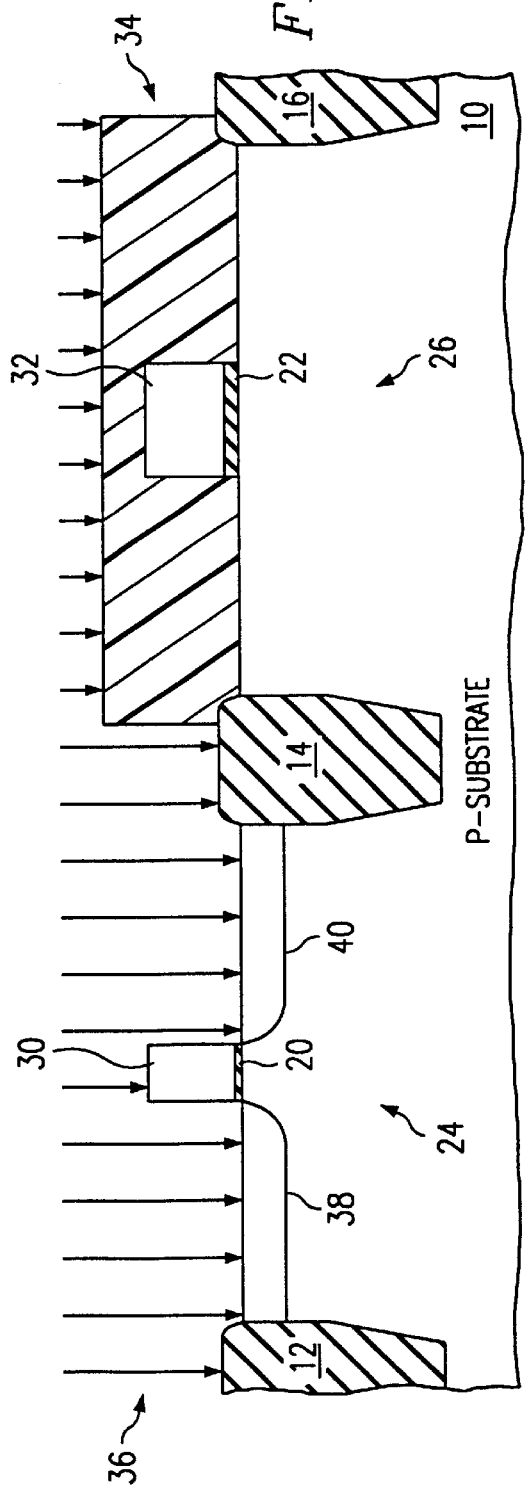
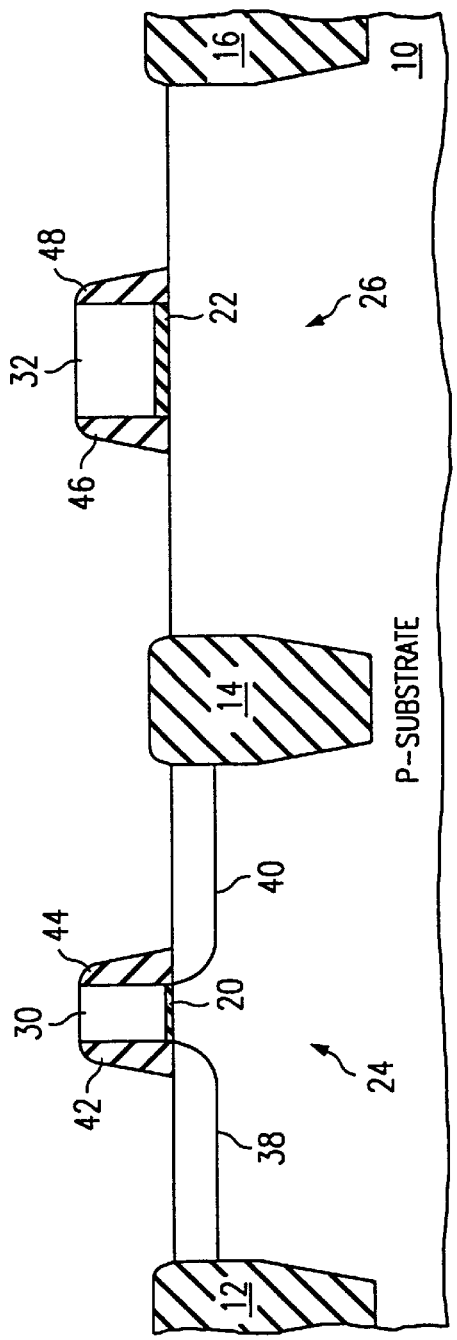

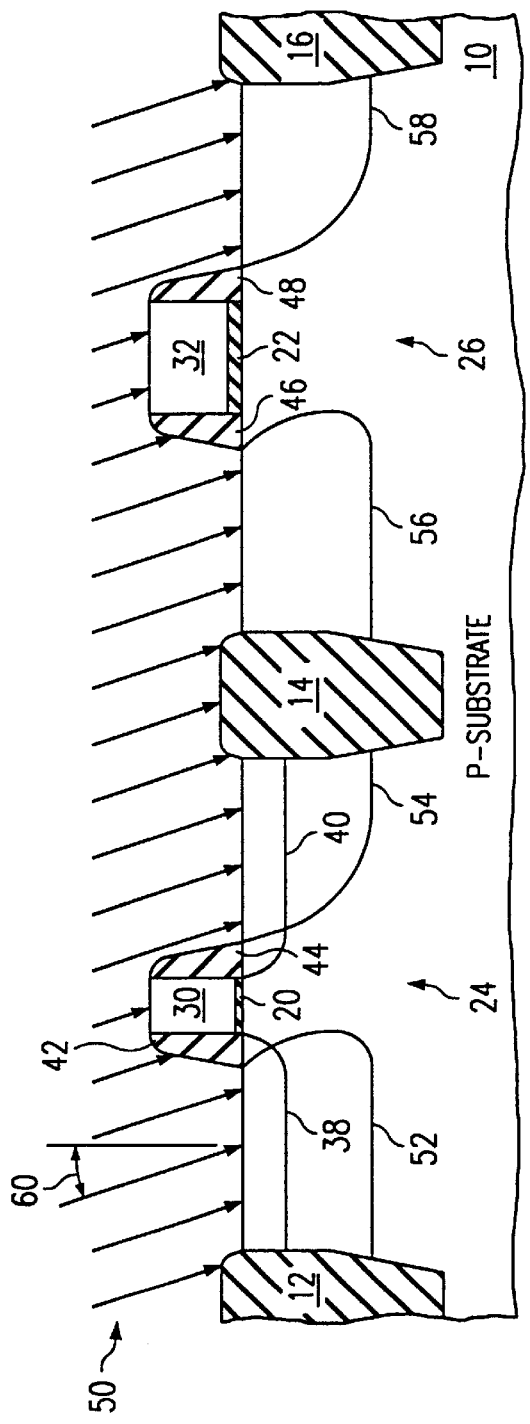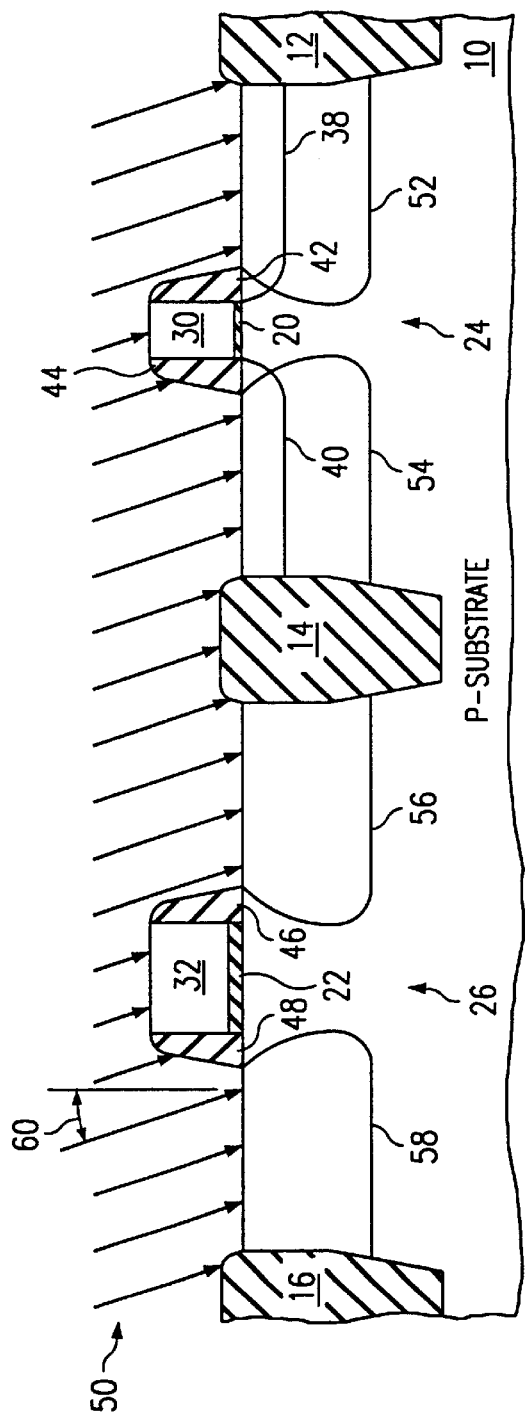

SOURCE DRAIN IMPLANT PROCESS FOR MIXED VOLTAGE CMOS DEVICES

This application claims priority under 35 USC § 119(e)(1) of provisional application No. 60/097,826 filled on Aug. 25, 1998.

TECHNICAL FIELD OF THE INVENTION

The present invention relates in general to the field of integrated circuit manufacturing, and more particularly, to methods for simultaneously creating source-drain regions with different profiles for both low voltage devices and high voltage devices on the same substrate.

BACKGROUND OF THE INVENTION

Without limiting the scope of the invention, its background is described in connection with the manufacture and formation of CMOS integrated circuit components for dual voltages, as an example.

Heretofore in this field, to improve reliability and reduce power consumption, the supply voltage of CMOS devices has been diminished with decreasing feature sizes and increasing performance. While circuit voltages are approaching 1 V, however, external supply voltages may remain at higher values from 1.5 to 5 V. This calls for mixed voltage CMOS technologies where the core circuits typically utilize very low voltages, such as a voltage between approximately 1.5 V to 1.8 V, and the input-output circuits typically use higher supply voltages, such as a voltage between approximately 3.3 V to 5 V.

The merger of low and high voltages becomes increasingly difficult to accomplish without an increase in the number of lithography steps. At the same time, the well known hot electron problems in the NMOS transistors at high drain voltages are of serious concern.

Various approaches have been aimed at reducing the voltage stress at the drains of N-transistors or reducing the intensity of electric fields in the channel region to minimize the generation of hot electrons, such as a normal lightly doped drain (LDD). A common approach to fabricating devices on the same substrate with different operating voltages is to reproduce existing process flows for low voltage and high voltage circuits separately. The result is differentiated gate length, gate oxide thickness, source-drain extensions and junctions, as shown in FIG. 1. Thus, the low voltage circuits have short channel lengths, thin gate oxides, shallow source-drain extensions, and shallow source-drain areas, while the high voltage circuits have longer channel lengths, thicker gate oxides, deeper source-drain extensions, and deeper source-drain areas. This is, however, a very expensive and time consuming approach.

An alternative is to incorporate in high voltage circuits source-drain extensions and junctions that are suitable for low voltage circuits, as depicted in FIG. 2. As shown in FIG. 2, the high voltage circuit has a longer channel length and thicker gate oxide than the low voltage circuit, but both have shallow source-drain areas and shallow source-drain extensions. In this case, the high voltage circuits would therefore have poor hot carrier reliability because of the high electric fields under the gate oxide by the junction. Electrostatic discharge protection may also be lacking because of the shallow junctions.

Deepening the junctions to alleviate this problem by increasing the implant energy, as shown in FIG. 3, degrades the performance of low voltage transistors because of increased junction capacitance and lower current drive. As shown in FIG. 3, the high voltage circuits have longer channel lengths and thicker gate oxides than the low voltage circuits, while both have intermediate source-drain areas and intermediate source-drain extensions. Thus, the dilemma between product reliability and economical efficiency calls for a process improvement to resolve these two conflicting factors.

SUMMARY OF THE INVENTION

What is needed is a method for designing and manufacturing integrated circuits using source-drain extensions only for low voltage devices and angular source-drain implants to create appropriate profiles of source-drain regions for high voltage devices.

In accordance with the present invention, a mask is applied to cover the high voltage device regions, allowing the low voltage device regions to be exposed to standard LDD or mid doped drain (MDD) implants to obtain source-drain extensions. Thereafter, the source-drain regions for both the low voltage device and the high voltage device are subject to a conditioned acute angular implant that creates appropriate profiles for high voltage device source-drain regions and fitting junctions for low voltage devices, which, in combination with the source-drain extensions, assures the performance of the low voltage devices. Implant conditions such as energy, dose, angle, and thermal drive may be tailored in accordance with the desired final product.

Moreover, there is no need to process the source-drain regions of the low voltage device and the high voltage device in separate steps to achieve their distinct features, resulting in economic fabrication of a mixed voltage CMOS integrated circuit by reducing the number of processing steps.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIGS. 1–3 are cross-sectional views of known forms of a high voltage device and a low voltage device sharing a common substrate;

FIGS. 4–10 are cross-sectional views of the process steps in accordance with a preferred embodiment of the present invention.

DESCRIPTION OF THE PREFERRED EMBODIMENTS

Figure 11:
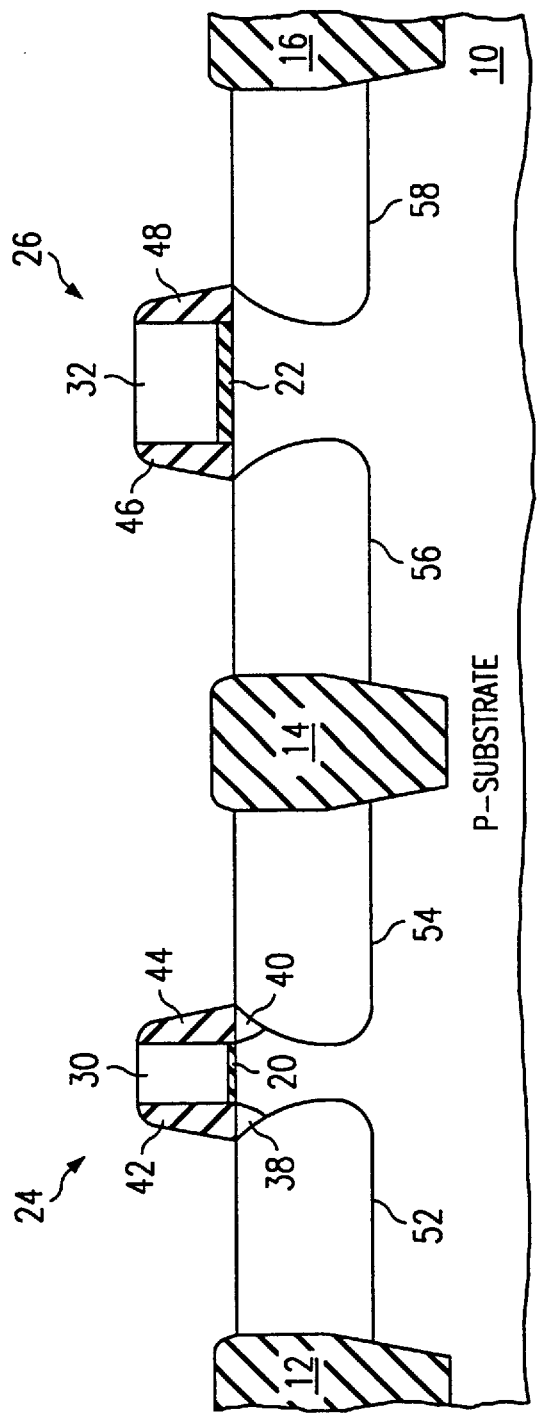
FIG. 11 is a cross-sectional view of a preferred embodiment of the present invention.

While the making and using of an embodiments of the present invention are discussed in detail below, it should be appreciated that the present invention provides applicable inventive concepts which can be embodied in a wide variety of specific contexts. The specific embodiment discussed herein is merely illustrative of specific ways to make and use the invention and does not delimit the scope of the invention.

Turning now to FIG. 4, a cross-sectional view of a portion of substrate 10 in isolation for a CMOS device is shown in accordance with one embodiment of the present invention. Substrate 10 is a semiconductor wafer which may be composed of silicon, gallium arsenide, or other semiconductor material used in electronic device manufacturing. In accordance with the present invention, at the initial stage of the process, field oxides 12, 14 and 16 are formed utilizing conventional techniques on substrate 10.

Next as shown in FIG. 5, gate oxides 20 and 22 are formed utilizing conventional techniques. Gate oxides 20 and 22 are typically composed of silicon dioxide. N-channel low voltage device 24 has a thin gate oxide 20, typically 40 Angstroms thick, while N-channel high voltage device 26 has a thicker gate oxide 22, typically 80 Angstroms thick; however, gate oxide 20 may be of other thicknesses, such as in the range of approximately 20 Angstroms to approximately 60 Angstroms, and gate oxide 22 may be of other thicknesses, such as in the range of approximately 40 Angstroms to approximately 140 Angstroms. P-channel low voltage devices and high voltage devices are not shown.

As shown in FIG. 6, polysilicon layers are then deposited, patterned and etched accordingly onto. gate oxides 20 and 22, respectively, to form gates 30 and 32. Custom patterning and etching of the polysilicon layers may be utilized to tailor the size of gates 30 and 32. The channel length for low voltage device 24 is typically in the range of approximately 0.10 micron to approximately 0.25 micron, while the channel length for high voltage device 26 is typically in the range of approximately 0.25 micron to approximately 0.6 micron.

A photoresist layer 34 is then formed over a region of high voltage device 26 and the P-channel low voltage device regions (not shown). A standard light or mid N-source-drain implant of dopants (impurities) 36 is then made, having effect only in the unmasked regions, as shown in FIG. 7. The implant of N-dopants 36 is typically perpendicular to the surface of substrate 10, and results in a concentration on the order of approximately $10^{14}$ ions/cm$^2$, and may be in the range of approximately $1\times10^{14}$ ions/cm$^2$ to approximately $1\times10^{15}$ ions/cm$^2$, for example. The implant conditions for the source-drain extension areas 38 and 40 may, however, be customized according to the desired performance and reliability requirements for low voltage device 24.

Photoresist layer 34 is then removed, and a new photoresist layer is formed over all the regions of high voltage device 26 and the N-channel device regions of the low voltage devices 24. A standard light or mid P-source-drain implant of doplants is made, having effect only in the unmasked regions (not shown). The implant of ions is typically perpendicular to the surface of substrate 10 and results in a concentration on the order of approximately $10^{14}$ ions/cm$^2$, and may be in the range of approximately $3\times10^{14}$ ions/cm$^2$ to approximately $8\times10^{14}$ ions/cm$^2$, for example; however, the implant conditions may be customized according to the desired source-drain profile for the P-channel low voltage devices.

As shown in FIG. 8, after the second photoresist layer is stripped, a dielectric is deposited and etched back to form side wall layers (spacers) 42 and 44 next to gate 30 of low voltage device 24, and side wall layers 46 and 48 next to gate 32 of high voltage device 26. The thickness of spacers 42, 44, 46 and 48 can be adjusted for low voltage device 24 and high voltage device 26.

Once spacers 42, 44, 46 and 48 are in place, another photoresist layer is formed to mask out all the P-channel device regions, and a heavy angular implant of N+type dopants 50 is made in all the N-channel source-drain regions 52, 54, 56 and 58 for both low voltage device 24 and high voltage device 26, as shown in FIG. 9. Implant of N+type dopants 50 is made at an acute angle 60. Acute angle 60 is less than 90° and may be, for example, an angle in the range of approximately 25° to approximately 35° from a line perpendicular to the top surface of substrate 10. Substrate 10 may be rotated a quarter-turn three times during implant of N+type dopants 50 to get even exposure to the implant as shown FIG. 10. After implanting during such rotation of substrate 10, the concentration of N+type dopants in source-drain regions 52, 54, 56 and 58 is on the order of $10^{15}$ ions, such as $1.5\times10^{15}$ ions/cm$^2$, for example. The implant conditions and species may, however, be tailored according to the desired reliability and performance characteristics of low voltage device 24 and high voltage device 26.

Once the photoresist layer is stripped, a new photoresist pattern for a similar angular implant of dopants for P-channel device regions is formed, and the N-channel device regions are masked. Source-drain regions for both the P-channel low voltage devices and the P-channel high voltage devices are then heavily doped with P-type implant material (not shown). Substrate 10 may be similarly rotated to get even exposure to the P-type implant, such that the total concentration of P-type dopants in the source-drain regions of the P-channel devices is on the order of $10^{15}$ ions/cm$^2$, such as $3\times10^{15}$ ions/cm$^2$, for example. The implant conditions, however, may be customized according to the desired profiles of the P-channel low voltage devices and the P-channel high voltage devices.

A thermal drive may then be performed to allow for activation of the implants and for a transition region between the heavily doped source-drain regions 56 and 58 and the channel area of high voltage device 26. Therefore, the transition regions of high voltage device 26 function as extensions since they reduce the electric field strength under the gate. Furthermore, the angled setting for the source-drain implant, as shown in FIGS. 9 and 10, diminishes the dopant gradient between the bulk source-drain and the channel regions and to place the highest current density volume away from the silicon/silicon-dioxide interface.

The resulting device in accordance with a preferred embodiment of the present invention is depicted in FIG. 11. As shown, low voltage device 24 includes a short channel, a thin gate oxide 20, shallow source-drain extensions 38 and 40, and source-drain regions 52 and 54, which may be customized. High voltage circuit 26, on the other hand, includes a long channel, a thick gate oxide 22, no source-drain extensions, and source-drain regions 56 and 58, which may be customized. Thus, without using any additional costly manufacturing process steps, the design of the low voltage device 24 and high voltage device 26 on the same substrate 10 in accordance with the present invention allows for the independent optimization of both.

It should be noted that the devices of the present invention may be implemented using various conductivity types and concentrations other than the ones described above. In addition, while CMOS devices have been used herein to illustrate the features of the present invention, it should be appreciated by one skilled in the art that the principles of the present invention are wholly applicable to many other types of circuits including an embedded memory in a logic device, for example.

It should also be noted that in the examples herein, the "mixed" voltage devices are for two different voltages, but the invention can be used with more than two voltages. Thus, the term, "mixed" as used herein means "at least two."

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for manufacturing a mixed voltage CMOS integrated circuit comprising the steps of:
   (a) forming a first gate oxide and a second gate oxide on the substrate;
   (b) forming a first gate on the first gate oxide and a second gate on the second gate oxide;
   (c) lightly implanting the substrate with dopants of a first conductivity type, wherein a first photoresist layer is patterned to mask the second gate, the source and drain regions associated with the second gate, and the regions associated with transistors having channels of a second conductivity type;
   (d) forming side wall dielectrics next to the first gate and next to the second gate;
   (e) heavily implanting the substrate at an acute angle with dopants of the first conductivity type, wherein a second photoresist layer is patterned to mask the regions associated with transistors having channels of the second conductivity type.

2. The method as recited in claim 1, wherein the second gate oxide is thicker than the first gate oxide.

3. The method as recited in claim 1, wherein the second gate is longer than the first gate.

4. The method as recited in claim 1, wherein the acute angle is in the range of approximately 25 and approximately 35 from a line vertical to the substrate.

5. The method as recited in claim 1, wherein the substrate is rotated at least once during step (e).

6. The method as recited in claim 1, wherein the first conductivity type is N-type.

7. The method as recited in claim 1, wherein the first conductivity type is P-type.

8. The method as recited in claim 1, further comprising the step of forming a side wall oxide.

9. The method as recited in claim 1, further comprising the step of applying a thermal drive.

10. A method for manufacturing a CMOS integrated circuit with a first voltage device and a second voltage device comprising the steps of:
    (a) obtaining active regions in a substrate with gates for both the first voltage device and the second voltage device;
    (b) obtaining lightly implanted source and drain regions for the first voltage device;
    (c) forming a side wall dielectric next to each gate; and
    (d) angularly implanting each of the source and drain regions with an impurity of a selected type for both the first voltage device and the second voltage device, to eliminate the need for separately implanting the first voltage device and second voltage device with source-drain profiles.

11. The method as recited in claim 10, wherein step (b) further comprises formation of lightly implanted source and drain regions for N-channel devices and P-channel devices sequentially.

12. The method as recited in claim 10, wherein the angularly implanting is at an angle in the range of approximately 25° to approximately 35° from a line vertical to the substrate.

13. The method as recited in claim 10, wherein the impurity of a selected type in step (d) is N-type.

14. The method as recited in claim 10, wherein the impurity of a selected type in step (d) is P-type.

15. The method as recited in claim 10, wherein the first voltage device is a low voltage device.

16. The method as recited in claim 10, wherein the second voltage device lacks source-drain extension areas.

17. The method as recited in claim 10, wherein the substrate is rotated during step (d).

18. The method as recited in claim 10, further comprising the step of applying a thermal drive.

19. An integrated circuit produced by the method of claim 10.

20. A low voltage and high voltage CMOS apparatus formed after performing the steps of:
    (a) obtaining active regions in the substrate with gate oxides of differentiated thicknesses for the low voltage devices and the high voltage devices;
    (b) obtaining lightly implanted source and drain regions with N-type impurities for N-channel low voltage devices;
    (c) obtaining lightly implanted source and drain regions with P-type impurities for P-channel low voltage devices;
    (d) forming side wall dielectrics next to each gate with selected widths for the low voltage devices and the high voltage devices;
    (e) angularly implanting the source and drain regions of the N-channel low voltage devices and the N-channel high voltage devices with additional N-type impurities;
    (f) angularly implanting the source and drain regions of the P-channel low voltage devices and the P-channel high voltage devices with additional P-type impurities; and
    (g) applying an appropriate thermal drive.

21. The apparatus as recited in claim 20, wherein the channel length of the low voltage devices is shorter than the channel length of the high voltage devices.

22. The apparatus as recited in claim 20, wherein the high voltage devices have no source drain extension areas.

* * * * *